US010274846B2

(12) United States Patent
Wesselingh et al.

(10) Patent No.: US 10,274,846 B2
(45) Date of Patent: Apr. 30, 2019

(54) ELECTROMAGNETIC DRIVE COMPRISING A STATOR AND A STATOR HOLDER

(71) Applicant: Carl Zeiss SMT GmbH, Oberkochen (DE)

(72) Inventors: Jasper Wesselingh, Moettingen (DE); Axel Lorenz, Meissen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/906,346

(22) Filed: Feb. 27, 2018

(65) Prior Publication Data

US 2018/0191233 A1 Jul. 5, 2018

Related U.S. Application Data

(63) Continuation of application No. PCT/EP2016/069857, filed on Aug. 23, 2016.

(30) Foreign Application Priority Data

Sep. 8, 2015 (DE) .................. 10 2015 217 119

(51) Int. Cl.
*G03B 27/54* (2006.01)
*G03F 7/20* (2006.01)
(Continued)

(52) U.S. Cl.
CPC ...... *G03F 7/70825* (2013.01); *G03F 7/70008* (2013.01); *G03F 7/70258* (2013.01);
(Continued)

(58) Field of Classification Search
CPC ........ H02K 41/0356; H02K 3/42; H02K 1/12; H02K 1/14; H02K 1/141; H02K 1/143;
(Continued)

(56) References Cited

U.S. PATENT DOCUMENTS 6,717,323 B1\* 4/2004 Soghomonian ........ H02K 1/141
310/156.47
2008/0158539 A1 7/2008 Shibata
(Continued)

FOREIGN PATENT DOCUMENTS

JP         H09-303599 A      11/1997
WO   WO 2005/026801 A2    3/2005

OTHER PUBLICATIONS

International Search Report for corresponding PCT Appl No. PCT/EP2016/069857, dated Nov. 16, 2016.
(Continued)

*Primary Examiner* — Christina A Riddle
(74) *Attorney, Agent, or Firm* — Fish & Richardson P.C.

(57) ABSTRACT

An electromagnetic drive includes a stator, having a stator holder and an actuating element which is movable by electromagnetic interaction with the stator. The stator holder has at least two electrically conductive paths running separately from and adjacent to one another. In each case, the two paths running separately from and adjacent to one another form a path pair, and the paths of the path pair are connected to one another in electrically conductive fashion at their respective ends. The paths of the path pair are arranged such that the stator and/or the actuating element induces eddy currents acting in opposite directions in the paths.

20 Claims, 6 Drawing Sheets

(51) Int. Cl.
*H02K 41/035* (2006.01)
*H01F 7/126* (2006.01)
*H02K 3/42* (2006.01)
*H01F 7/16* (2006.01)

(52) U.S. Cl.
CPC ...... *G03F 7/70266* (2013.01); *G03F 7/70383* (2013.01); *G03F 7/70758* (2013.01); *G03F 7/70841* (2013.01); *H01F 7/126* (2013.01); *H02K 3/42* (2013.01); *H02K 41/0356* (2013.01); *H01F 7/1607* (2013.01)

(58) Field of Classification Search
CPC ........ H02K 1/145; H02K 1/146; H02K 1/148; H02K 1/17; H02K 15/02–15/03; H02K 16/04; H02K 23/36; H02K 41/06; H01F 7/126; H01F 7/1607; G03F 7/70008; G03F 7/70383; G03F 7/70825; G03F 7/70841; G03F 7/70258; G03F 7/70266; G03F 7/70308; G03F 7/70316; G03F 7/70758; G03F 7/70833; G03F 7/709; G03F 7/7095; G03F 7/70975

USPC .... 355/52, 53, 55, 67–77; 250/492.1, 492.2, 250/492.22, 493.1; 310/49.23, 49.26, 310/49.29, 49.33, 49.34, 49.46, 49.51, 310/156.23, 156.34, 156.35, 156.37, 310/254.1, 256, 260; 359/683, 694, 359/696–706, 813–814, 819, 822–830, 359/871–877

See application file for complete search history.

(56) References Cited

U.S. PATENT DOCUMENTS

2009/0230807 A1\* 9/2009 Fubuki .................... H02K 3/18
310/201
2014/0312718 A1 10/2014 Li et al.

OTHER PUBLICATIONS

German Office Action, with translation thereof, for corresponding DE Appl No. 10 2015 217 119.1, dated Jun. 29, 2107.

\* cited by examiner

ELECTROMAGNETIC DRIVE COMPRISING A STATOR AND A STATOR HOLDER

CROSS-REFERENCE TO RELATED APPLICATIONS

The present application is a continuation of, and claims benefit under 35 USC 120 to, international application PCT/EP2016/069857, filed Aug. 23, 2016, which claims benefit under 35 USC 119 of German Application No. 10 2015 217 119.1, filed Sep. 8, 2015. The entire disclosure of these applications are incorporated by reference herein.

FIELD

The disclosure relates to an electromagnetic drive having a stator and having a stator holder. The disclosure also relates to a projection exposure apparatus for semiconductor lithography, having an illumination system with a radiation source and with an optical unit which has at least one optical element.

BACKGROUND

Electromagnetic drives based on the known physical phenomena of the Lorentz force or reluctance force are used for a wide variety of actuating tasks. With the aid of electrical coils and magnetic materials, the interaction between electrical and magnetic fields and a force action that is generated are utilized such that the electrical energy is ultimately converted into mechanical energy. In accordance with this principle, either rotational or linear (translational) movements can be performed.

Electromagnetic drives are used inter alia in projection exposure apparatuses for semiconductor lithography for the purposes of mechanically influencing or manipulating or deforming optical elements in the illumination systems thereof, for example in order to control the beam path of a radiation source.

In this regard, it is known from WO 2005/026801 A2 to adjust optical elements, such as mirrors, for EUV projection exposure apparatuses in multiple degrees of freedom using driveable movement axes via Lorentz actuators. Plunger coil actuators can be used for this purpose, wherein a linearly moveable actuating element (translator) in the form of a magnet can be mechanically influenced by electromagnetic interaction with a statically mounted coil surrounding the translator. In this case, the translator is connected to the optical element, to which a movement carried out can be directly transmitted. The coil itself, which in this embodiment is in the form of a stator, is in the case of such an arrangement connected via a stator or coil holder to surrounding structures, for example a housing part.

An issue in the case of an electromagnetic drive of the type having a coil and a coil holder is that the coil holder can also inductively interact with the coil. The current flow in the coil generates a magnetic field which, aside from the desired effect on the translator or rotor, additionally induces parasitic eddy currents in nearby conductive materials such as the coil holder. The abovementioned eddy currents then likewise generate a magnetic field, which opposes the original field in the coil. In this way, the efficiency of the energy conversion of the drive, or a force action on the translator or the rotor, is reduced. In particular in the case of high frequencies, control errors can thus arise in a control loop, to the point of instability of the system, owing to lags of the manipulated variable. A similar issue also arises if, in an alternative embodiment, the actuating element is formed as a coil and the stator is formed as a magnet, or both devices are formed as coils.

To prevent or reduce an undesired induction of eddy currents in the coil holder, it is known to use a non-conductive material to form the coil holder. However, in numerous applications, it is desirable for heat losses that arise in the coil to be dissipated, via adequate thermal conductivity of the coil holder, in order to lengthen the service life of the coil. It is known that materials with good thermal conductivity normally likewise exhibit good electrical conductivity. Ceramics, which are poor electrical conductors but good thermal conductors, are an exception to this. The processing of ceramics is however technically complex and leads to considerably greater component tolerances than, for example, the metal processing methods that are customary for metals.

A further approach for reducing undesired induced eddy currents involves shortening the long electrically conductive path in the coil holder via electrically insulating slots. The coil holder is thus divided into relatively small segments, such that a continuous current flow through the entire component can no longer form. However, in this approach, eddy currents are induced locally in the individual segments, and the adverse effect can thus be lessened only to a limited extent.

As an alternative to the abovementioned concepts, a so-called vibrating coil overhang is known. Here, the coil is extended such that the coil holder can be mounted at an adequately great distance from the translator or rotor. It is thereby sought to prevent or reduce a disruptive force action of the parasitic magnetic field originating from the coil holder on the translator or rotor. But issues relating to this approach are an enlarged structural form, a possibly increased transmission of vibrations owing to a lever action, and increased electrical losses owing to the enlarged coil, which can also adversely affect the service life owing to intensified heat generation.

SUMMARY

The disclosure seeks to provide an electromagnetic drive such that a stator holder has the least possible influence on a movement of an actuating element, wherein it is the intention for the stator holder to exhibit good thermal conductivity and to be producible from materials that are easy to process.

The disclosure seeks to provide a projection exposure apparatus for semiconductor lithography, having an efficient, easily producible electromagnetic drive, which can be controlled in a reliable manner, for adjusting or manipulating an optical element.

In one aspect, the disclosure provides an electromagnetic drive having a stator, having a stator holder and having an actuating element which is movable by electromagnetic interaction with the stator. The stator holder has at least two electrically conductive paths running separately from and adjacent to one another. In each case two paths running separately from and adjacent to one another form a path pair, and the paths of the path pair are connected to one another in electrically conductive fashion at their respective ends. The paths of the path pair are arranged such that the stator and/or the actuating element induces eddy currents acting in opposite directions in the paths.

The electromagnetic drive according to the disclosure has a stator, a stator holder, and an actuating element which is movable by electromagnetic interaction with the stator. The actuating element may in particular be an actuating element which is movable linearly or in translation, in particular a movable magnet (translator), or a rotatable actuating element. The actuating element may also be a coil.

According to the disclosure, the stator holder has at least two electrically conductive paths running separately from and adjacent to one another, wherein in each case two paths running separately from and adjacent to one another form a path pair, and the paths of the path pair are connected to one another in electrically conductive fashion at their respective ends, and wherein the paths of the path pair are arranged such that the stator and/or the actuating element induces eddy currents acting in opposite directions or counter to one another in the paths.

The stator is preferably a coil. Here, the actuating element is then preferably formed as a magnet. It is alternatively also conceivable for the stator and the actuating element to both be formed as coils.

The stator may however also be a magnet. In this case, the actuating element is then formed as a coil. Such a configuration has the advantage that less mass has to be moved. With regard to improved heat dissipation from the coil and simplified cable guidance, it is however normally advantageous for the stator to be formed as a coil and for the actuating element to be formed as a magnet.

By virtue of the fact that the stator has at least two paths that form a path pair, in which the stator and/or the actuating element induces eddy currents acting in opposite directions, the induced currents in the paths at least partially, preferably completely, cancel one another out, such that the stator holder itself generates only a small magnetic field, or preferably no magnetic field, caused by the eddy currents. The stator holder therefore no longer has any magnetic field, or any significant magnetic field, that can counteract the original field of the stator and/or actuation element provided for actuating the movable actuating element.

According to the disclosure, a stator holder can be realized which has at least one path pair with two paths, wherein one path of the past pair is formed as a return path, such that the resulting inductance of the stator holder is close to zero, and preferably is zero.

It is advantageous if the stator holder has exactly two paths, the respective ends of which are connected to one another in electrically conductive fashion, that is to say the paths have in each case one curve or one turn in the region of their ends.

According to the disclosure, every current induced in a first path of a path pair by the stator and/or by the actuating element can be canceled out by a current induced in the second path of the path pair and acting in the opposite direction.

The electrically conductive paths are preferably formed and/or arranged such that an induction action of the stator and/or of the actuating element on the stator holder is at least approximately canceled out.

The so-called inductive coupling factor is a measure of the mutual induction action between the stator/the actuating element and the stator holder. The factor normally lies in the range from approximately 0.1 to approximately 0.5, and is typically approximately 0.3. Embodiments according to the disclosure of the stator holder can realize an improvement here, and can inductively decouple the stator/the actuating element and the stator holder from one another. Embodiments may in particular have the result that an inductive coupling factor between the stator/the actuating element and the stator holder is lower than 0.1, or is particularly preferably lower than 0.01. Ideally, the stator holder according to the disclosure, the inductive coupling factor can be equal to zero.

Even if, owing to tolerances or frequency dependencies, the magnetic interaction between the stator and/or the actuating element and the stator holder is not exactly identical in the individual paths and thus one of the paths exhibits a quantitatively greater current intensity, the eddy currents, acting in opposite directions, of the paths of a path pair will substantially cancel one another out owing to their opposite directions, such that the magnetic field arising from the difference between the two current intensities is very weak or no longer has a disruptive effect.

It is furthermore advantageous if the paths of a path pair are designed and/or arranged such that the eddy currents induced in the paths of a path pair quantitatively at least approximately correspond.

According to the disclosure, it may be provided that the flow direction of the current in the respective path of a path pair arises entirely or at least substantially from the magnetic interaction with the stator and/or the actuating element, and the currents acting in opposite directions in the paths of a path pair completely or approximately completely cancel one another out.

It may be provided according to the disclosure that the stator holder has at least one gap running in an axial direction, such that the stator holder has at least two ends which face one another, and are spaced apart from one another, in a circumferential direction.

As a result of the formation of a gap which runs in an axial direction and which extends through the stator holder, a continuous current flow through the entire component is prevented. An adhesive and/or an insulator may possibly be introduced into the gap.

According to the disclosure, it may be provided that the ends of the paths of a path pair are in each case electrically connected to one another in the region of the ends, facing one another in a circumferential direction, of the stator holder.

By this measure, the entire current induced in the stator holder is substantially or completely canceled out owing to the oppositely directed flow direction of the current in the paths.

The stator holder can have multiple stator holder segments which are electrically separated from one another in a circumferential direction, wherein the stator holder segments have in each case at least two electrically conductive paths running separately from and adjacent to one another, wherein in each case two paths running separately from and adjacent to one another form a path pair, and the paths of the path pair of a stator holder segment are connected to one another in electrically conductive fashion at their respective ends.

Using the optionally possible embodiment of the stator holder with multiple separate stator holder segments, a continuous current flow through the entire component is prevented, and the currents induced in each case in the stator holder segments are kept quantitatively low.

It may be provided that the stator is arranged axially on the stator holder, wherein at least the paths of a path pair are arranged on the stator holder so as to be radially offset relative to one another.

An axial arrangement of the stator on the stator holder has proven to be suitable for numerous applications. To achieve that the eddy currents induced in the paths of a path pair cancel one another out, it has proven to be particularly suitable if, in the case of an axial fastening of the stator on the stator holder, the paths of a path pair are arranged on the stator holder so as to be radially offset with respect to one another.

For an axial fastening of the stator on the stator holder, it has furthermore proven to be particularly suitable for the stator holder to have exactly one path pair formed from two paths, wherein the paths are arranged so as to be radially offset with respect to one another.

It is advantageous if the paths of a path pair on the stator holder serve as a fastening surface for the fastening of the stator, possibly using an adhesive. That is to say, the stator bears directly against the paths of a path pair, possibly also the paths of multiple path pairs.

It is advantageous if, in the case of an axial fastening of the stator to the stator holder, the paths of a path pair are formed by an electrically insulating gap which runs in an axial direction between the ends of the paths.

Paths of a path pair can be formed on the stator holder in a simple manner via the gaps. The profile of the gap furthermore has the advantage that the gap does not reduce the dissipation of the heat losses of the stator, or of a coil, to a relevant extent, such that the heat dissipation is not adversely affected.

It is advantageous if the gaps are of very thin form, in order that they practically do not influence the dissipation of the heat losses of the stator or of a coil. The thickness of the gap may in this case preferably be selected such that it is ensured that the two paths are electrically insulated with respect to one another. An adhesive and/or an insulator may possibly be introduced into the gap between two electrically conductive paths, running adjacent to one another, of a path pair.

As already stated, the paths of a path pair are preferably configured and/or arranged such that the eddy currents induced in the paths of a path pair quantitatively at least approximately correspond. Structural symmetry of the paths may therefore be advantageous. Since, in the case of an arrangement of the paths of a path pair so as to be radially offset with respect to one another, the outer path is longer than the inner path, it may be advantageous, depending on the construction of the stator holder and/or of the stator and/or of the actuating element, for symmetry in the mutual inductance between stator and/or actuating element and path pairs of the stator holder to be produced in some other way. It is advantageous for the paths to be configured, or to run, such that the eddy currents induced in the paths quantitatively at least approximately correspond, or the induction action of the stator and/or of the actuating element on the stator holder is at least approximately canceled out. For this purpose, it may be provided that a radially inner path of a path pair is formed so as to be shorter in an axial direction, and/or has a smaller radial thickness, than a path, which runs adjacent to the former path and is situated radially further to the outside, of the path pair.

The stator may be arranged radially on the stator holder, wherein at least the paths of a path pair are arranged on the stator holder so as to be axially offset relative to one another.

In the case of a radial fastening of the stator to the stator holder, it has proven to be advantageous if the paths of a path pair are arranged on the stator holder so as to be axially offset with respect to one another. It is advantageous here if the stator holder has exactly one path pair, the two paths of which are arranged so as to be axially offset with respect to one another.

Structural symmetry of the configuration of the paths can be easily realized in the case of a radial arrangement of the stator on a stator holder, such that the eddy currents induced in the paths of a path pair quantitatively at least approximately correspond and, owing to the oppositely directed effect of the eddy current in the paths, the stator holder forms no magnetic field or no relevant magnetic field.

It is advantageous if the paths of the path pairs are formed as a fastening surface for the fastening of the stator to the stator holder, and the stator is preferably fastened directly, possibly with the use of an adhesive, to the stator holder or paths of the path pairs.

It is advantageous if, in the case of a radial fastening of the stator to the stator holder, the paths of a path pair are formed by a electrically insulating gap which runs in a radial direction between the ends of the paths.

In the case of a radial fastening of the stator to the stator holder, the paths can be formed in a particularly simple manner by an electrically insulating gap which runs in a radial direction. Here, the gap practically does not impair the dissipation of the heat losses of the stator or of the coil. Here, it may be advantageous for the gap to be formed so as to be as thin as possible, preferably such that an electrical insulation of the two paths is provided between the ends thereof, and on the other hand the thermal conductivity is also maximized. An adhesive and/or an insulator may possibly be introduced into the gap between two electrically conductive paths, running adjacent to one another, of a path pair.

It is advantageous if the stator holder encapsulates the stator. An encapsulation of the stator by the stator holder is advantageous in order, in the event of outgassing in particular of coil windings, to prevent contamination of a vacuum surrounding the electromagnetic drive, which is relevant in particular if the electromagnetic drive is used in an EUV projection exposure apparatus.

The stator may preferably have the following construction. For the fastening to the stator holder, the stator may have a fastening surface. Here, at an end situated opposite the fastening surface, the stator generally has an exposed surface. Furthermore, the stator generally has two side surfaces, which are arranged at right angles with respect to the fastening surface and the exposed surface and which run parallel to one another. For the encapsulation of the stator, it may thus preferably be provided that the stator holder adjoins the fastening surface, and in each case one electrically conductive path encompasses a side surface, and the two electrically conductive paths extend toward one another along the exposed surface of the stator in order to encapsulate the stator. Here, in this embodiment, it is preferably provided that the two ends of the electrically conductive paths do not make contact in the region of the exposed surface of the stator, but rather an electrically insulating layer, preferably an adhesive, is introduced between the paths. Such an embodiment is suitable in particular in the case of a stator holder to which the stator is fastened radially.

In the case of a stator holder to which the stator is fastened axially, it is preferably in turn provided that the stator holder adjoins the fastening surface of the stator. Here, it is the intention that in each case one electrically conductive path at least partially encompasses a side surface of the stator, wherein a cover is provided which covers at least the exposed surface of the stator, and wherein the cover is connected to the two paths in order to encapsulate the stator. Here, it is preferably provided that the cover is connected in electrically insulating fashion to at least one of the two paths, for which purpose use may preferably be made of an insulating layer, in particular an adhesive. The cover may also be connected in correspondingly insulating fashion to both paths. The cover may preferably be formed from metal, in particular from titanium. It is furthermore conceivable for the cover itself to be of electrically insulating form. In this embodiment, an electrically insulating connection between the cover and one or both paths may then possibly be omitted. The cover is preferably formed as a flat element, and the electrically conductive paths completely encompass the respective side walls.

Using the current flow in the stator and/or the actuating element, a magnetic field can be generated which also generates a parasitic eddy current in the cover, though this effect is generally negligible. To possibly eliminate this effect entirely, however, it may be provided that the cover is connected to one of the two paths of a path pair such that the cover is preferably included or incorporated into the eddy currents, which cancel one another out, of the two paths, such that the induced eddy currents in the two paths plus the cover that is connected to one of the two paths completely or at least approximately completely cancel one another out.

It is basically also possible for the cover to be formed in two parts, such that one part is electrically connected to a first path of a path pair and one part is electrically connected to a second path of the same path pair, and the two cover parts themselves are in each case electrically insulated with respect to one another.

The corresponding structural design of the paths and of the cover may, based on the selected construction, be such that an induction action of the stator and/or of the actuating element on the stator holder including the cover is at least approximately canceled out.

An embodiment of the stator holder with a cover is suitable in particular if the stator is attached axially to the stator holder, though may also be realized in the case of a radial arrangement of the stator.

It is advantageous if an adhesive is introduced into the gap between two conductive paths, running adjacent to one another, of a path pair and/or into the gap between two ends, facing one another in a circumferential direction, of the stator holder and/or between the stator and the stator holder and/or the stator and the cover and/or the paths and the cover.

Metal, preferably copper or aluminum, is particularly suitable as material for forming the stator holder, in particular with regard to easy processing and good thermal conductivity. It is however basically also possible for any other material, for example also ceramic, to be used, wherein the processing costs are then correspondingly higher. The disclosure makes it possible for the stator holder to be produced from metal, without the need to accept the adverse effect of parasitic eddy currents.

The stator holder is preferably of ring-shaped form.

It is advantageous if, in projection exposure apparatuses for semiconductor lithography, having an illumination system with a radiation source and with an optical unit, in particular an illumination optical unit, which has at least one optical element, the optical element is adjustable and/or manipulatable and/or deformable via one, preferably multiple, electromagnetic drive(s) as described above.

BRIEF DESCRIPTION OF THE DRAWINGS

Advantageous embodiments and variants of the disclosure are explained by way of example below on the basis of the drawings, in which.

DETAILED DESCRIPTION

Figure 1:
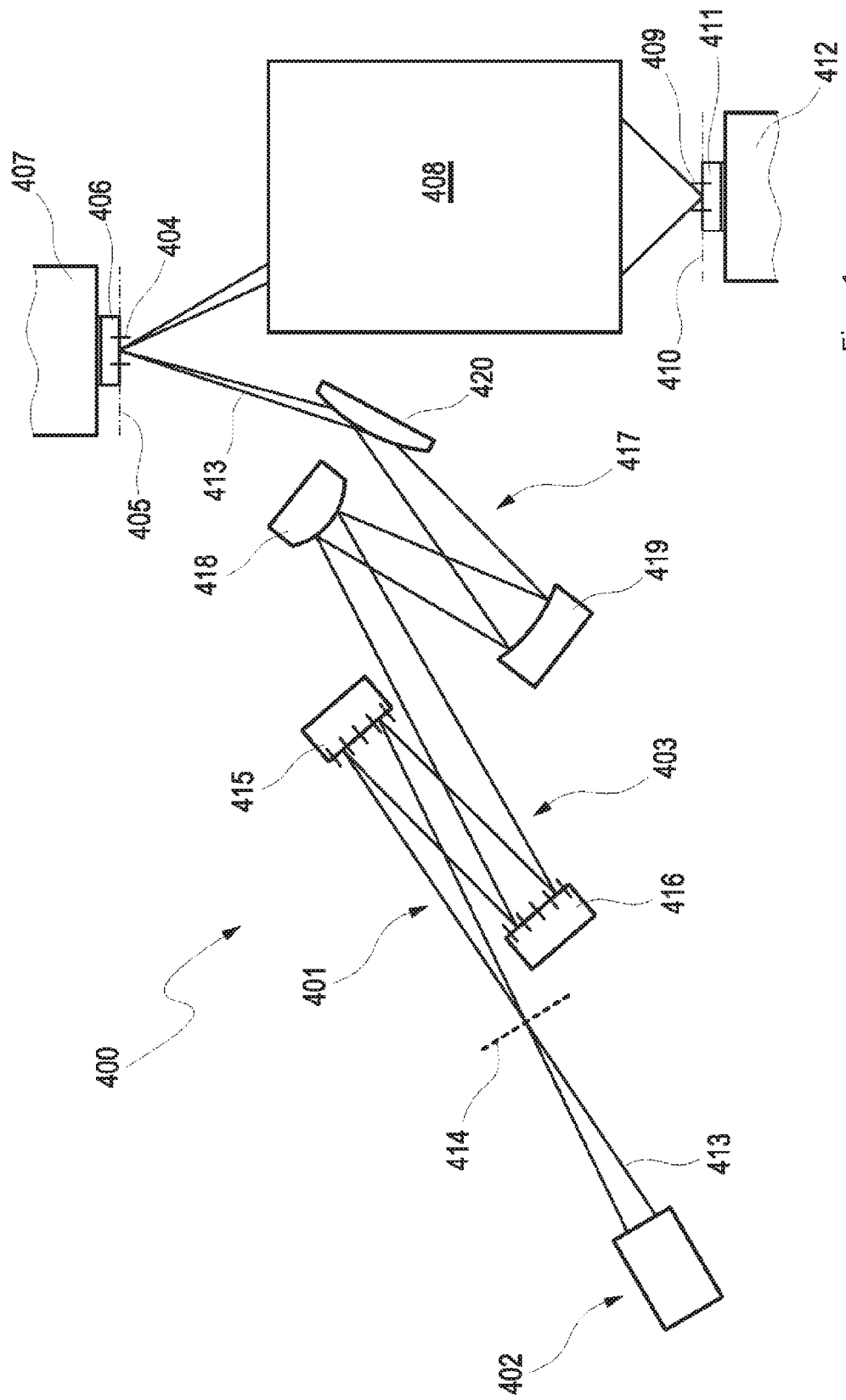
FIG. 1 shows a schematic illustration of an EUV projection exposure apparatus.

FIG. 1 shows by way of example the basic construction of an EUV projection exposure apparatus 400 for semiconductor lithography in which the disclosure can find application. An illumination system 401 of the projection exposure apparatus 400 includes, besides a radiation source 402, an optical unit 403 for the illumination of an object field 404 in an object plane 405. A reticle 406 arranged in the object field 404 is illuminated, the reticle being held by a reticle holder 407, illustrated schematically. A projection optical unit 408, illustrated merely schematically, serves for imaging the object field 404 into an image field 409 in an image plane 410. A structure on the reticle 406 is imaged on a light-sensitive layer of a wafer 411 held by a wafer holder 412 that is likewise illustrated in part, the wafer being arranged in the region of the image field 409 in the image plane 410. The radiation source 402 can emit used radiation in particular in the range between 5 nm and 30 nm. Optically differently designed and mechanically adjustable optical elements 415, 416, 418, 419 and 420 are used for controlling the radiation path of the used radiation. In the case of the EUV projection exposure apparatus 400 illustrated in FIG. 1, the optical elements are designed as adjustable mirrors in suitable embodiments, which are mentioned by way of example below.

EUV radiation 413 generated via the radiation source 402 is aligned via a collector, which is integrated in the radiation source 402, in such a way that the radiation passes through an intermediate focus in the region of an intermediate focal plane 414 before it is incident on a field facet mirror 415. Downstream of the field facet mirror 415, the EUV radiation 413 is reflected by a pupil facet mirror 416. With the aid of the pupil facet mirror 416 and an optical assembly 417 having mirrors 418, 419 and 420, field facets of the field facet mirror 415 are imaged into the object field 404.

Figure 2:
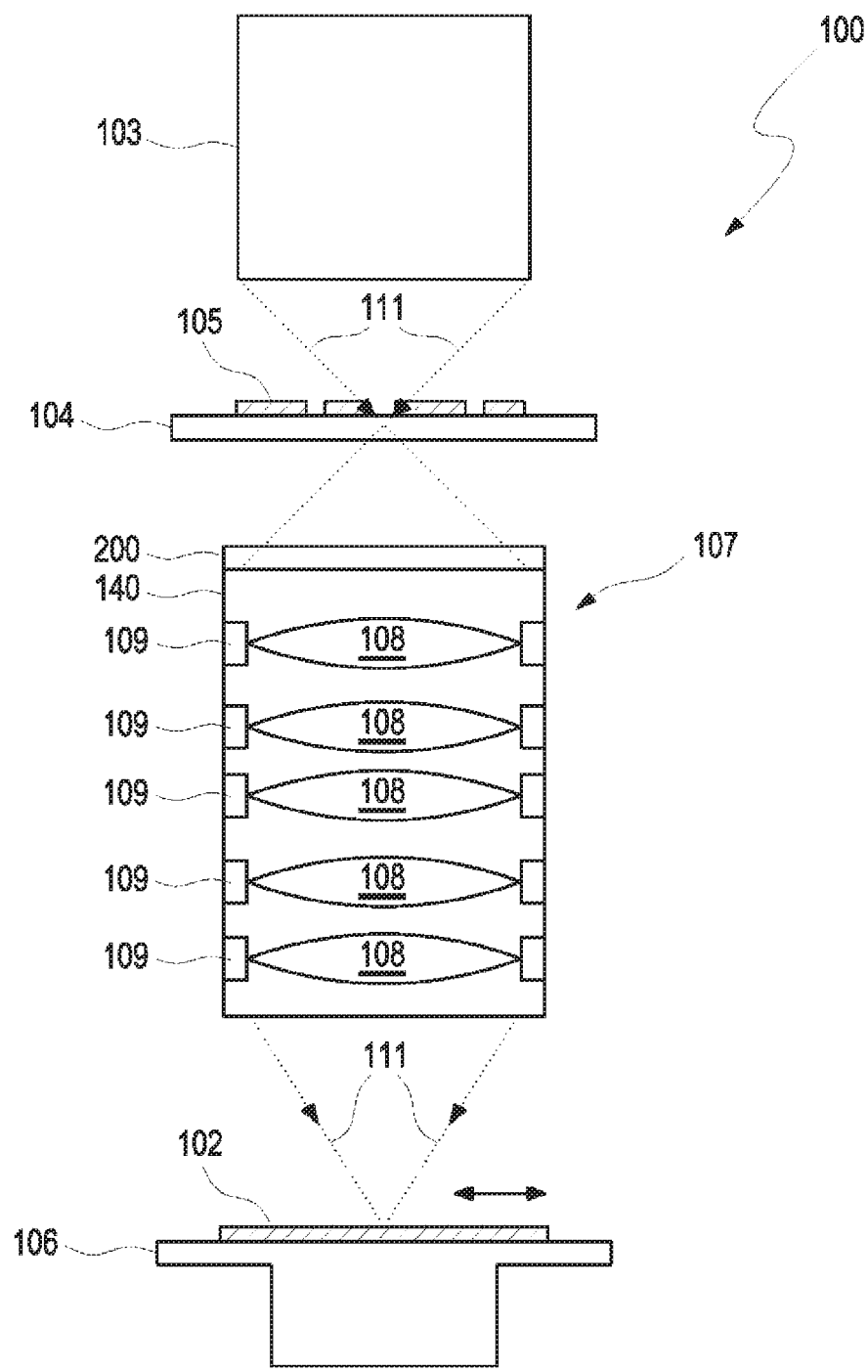
FIG. 2 shows a schematic illustration of a further projection exposure apparatus.

FIG. 2 illustrates an alternative projection exposure apparatus 100. The projection exposure apparatus 100 in this case includes an illumination system 103, a device 104 known as a reticle stage for receiving and exactly positioning the reticle 105, by which the later structures on the wafer 102 are determined, a device 106 for holding, moving and exactly positioning the wafer 102, and an imaging device, to be specific a projection lens 107, with multiple optical elements 108, which are held by way of mounts 109 in a lens housing 140 of the projection lens 107.

The optical elements 108 can be designed as individual refractive, diffractive and/or reflective optical elements 108, such as e.g. lens elements, mirrors, prisms, terminating plates and the like.

The basic functional principle in this case provides that an image of the structures introduced into the reticle 105 is projected onto the wafer 102, the imaging generally being on a reduced scale.

The illumination device 103 provides a projection beam 111 in the form of electromagnetic radiation, which is involved for the imaging of the reticle 105 on the wafer 102. A laser, plasma source or the like may be used as the source of this radiation. Optical elements in the illumination device 103 are used to shape the radiation in such a way that, when it is incident on the reticle 105, the projection beam 111 has the desired properties with regard to diameter, polarization, form of the wavefront and the like.

An image of the reticle 105 is produced by the beams 111 and transferred from the projection lens 107 onto the wafer 102 in an appropriately reduced form, as already explained above. In this case, the reticle 105 and the wafer 102 may be moved synchronously, so that regions of the reticle 105 are imaged onto corresponding regions of the wafer 102 virtually continuously during a so-called scanning operation.

FIG. 2 furthermore shows the arrangement of the manipulator 200 in the region between the reticle stage 104 and the first optical element of the projection lens 107. The manipulator 200 serves here for correcting image aberrations, wherein an optical element contained is mechanically deformed by an actuator arrangement, for which purpose the solution according to the disclosure can also be used.

The use of actuators of various designs is known for adjusting and/or for manipulating the optical elements 415, 416, 418, 419, 420, 108 of the projection exposure apparatuses 400, 100 illustrated in FIGS. 1 and 2 and wafers. The electromagnetic drives 1 illustrated in greater detail below in the exemplary embodiment with reference to FIGS. 3 to 10 are particularly suitable for use as an actuator for adjusting the optical elements 415, 416, 418, 419, 420, 108, but also the wafers 411, 102 or other components which are intended to be exactly adjusted, manipulated or deformed. The use of the electromagnetic drives according to the present disclosure is however not restricted to use in projection exposure apparatuses 100, 400.

The disclosure will be described below on the basis of an embodiment of the stator as a coil, wherein the description is to be understood in the sense that the stator may alternatively also be embodied as a magnet rather than as a coil.

Figure 3:
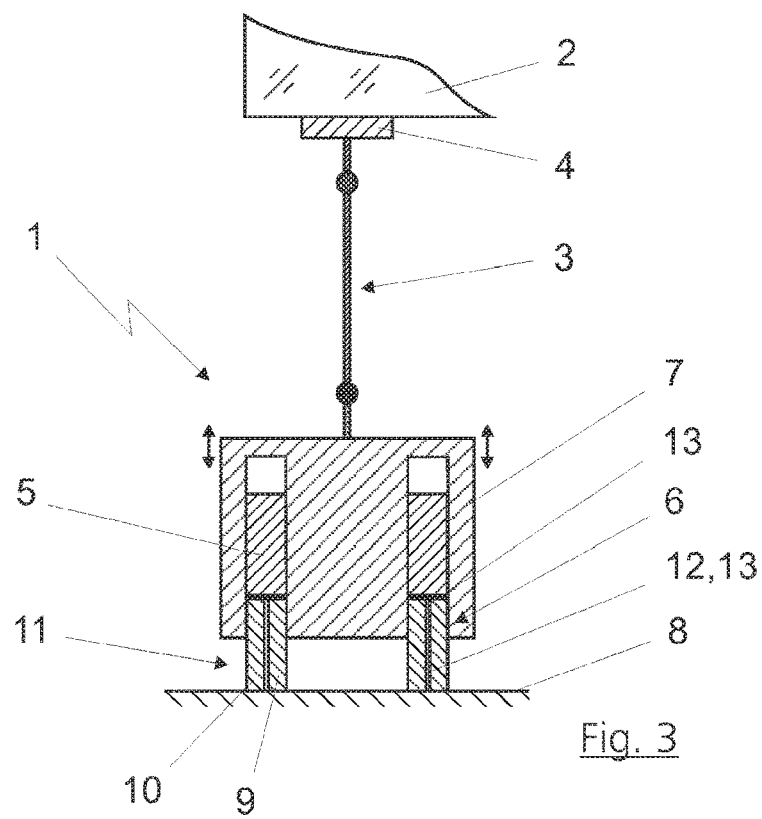
FIG. 3 shows a schematic illustration of an optical element having an electromagnetic drive according to the disclosure, in a first embodiment.

FIG. 3 shows an electromagnetic drive 1 according to the disclosure in an embodiment, illustrated by way of example, as a plunger coil actuator. The disclosure and the following exemplary embodiment should not be understood as being restricted to a specific structural form of an electromagnetic drive 1. The features in FIGS. 3 to 10 as illustrated below may be combined arbitrarily with one another, in so far as this is not ruled out from a technical standpoint.

With regard to the electromagnetic drive 1 according to the disclosure, only the features relevant for understanding the present disclosure will be discussed in more detail below, because electromagnetic drives are basically well known, in particular also the use thereof for the adjustment of optical elements of projection exposure apparatuses. The same also holds true with regard to the interaction between electric and magnetic fields and the force actions resulting therefrom.

The use of the electromagnetic drive 1 for manipulating, adjusting or deforming an optical element 2, as illustrated in FIG. 3, is to be regarded merely as an example, and serves merely for the schematic illustration of a possible installation situation.

As illustrated in FIG. 3, the electromagnetic drive 1 is connected to the optical element 2, which is preferably a lens or a mirror, via a basically known joint device 3. For this purpose, a contact surface 4 may be attached to the optical element 2 in a manner which is likewise known. The joint device 3 may be fastened to the contact surface 4.

The electromagnetic drive 1 according to the disclosure has a stator 5, which in this embodiment is formed as a coil 5, and a preferably ring-shaped stator holder 6 and an actuating element 7 which is movable by electromagnetic interaction with the coil 5. In the exemplary embodiments, the actuating element 7 is moved linearly or in translation, or is formed as a translator or as a movable magnet. Some other type of movement, in particular a rotational movement, is however basically also possible here. In the exemplary embodiment, the actuating element 7 is however designed for a linear movement.

Via a linear movement of the actuating element 7 effected by the electromagnetic interaction with the coil 5, an adjustment or manipulation or deformation of the optical element 2 is realized by the joint device 3 and the interface 4. The movement of the actuating element 7 is symbolized by the illustrated double arrows in FIG. 3.

As is schematically illustrated in FIG. 3, the stator holder 6 is immovably fixed, for example to a surrounding structure, a static machine frame 8, a housing part or the like.

The stator holder 6 of the electromagnetic drive 1 illustrated in FIG. 3 has two electrically conductive paths 9, 10 which run separately from and adjacent to one another and which together form a path pair 11.

Although not illustrated in the exemplary embodiment, it is basically also possible for more than two electrically conductive paths 9, 10 to be formed on the stator holder 6, wherein in each case two paths running separately from and adjacent to one another form a path pair.

Figure 6:
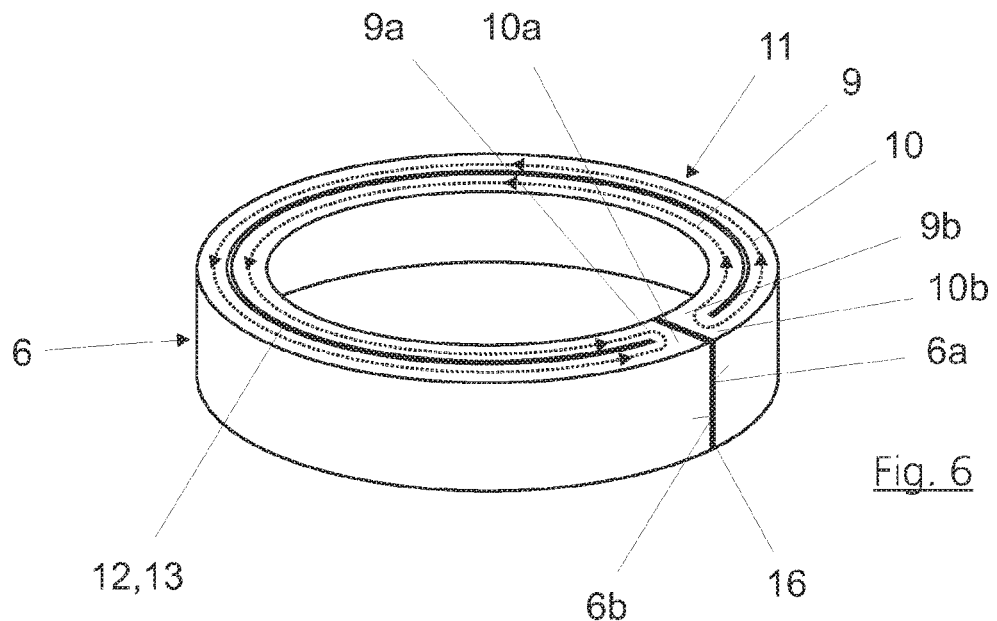
FIG. 6 shows a schematic illustration of a stator holder for the axial fastening of a stator (not illustrated), with arrows illustrating the flow direction of the eddy currents induced in the electrically conductive paths, which eddy currents act counter to one another.
Figure 7:
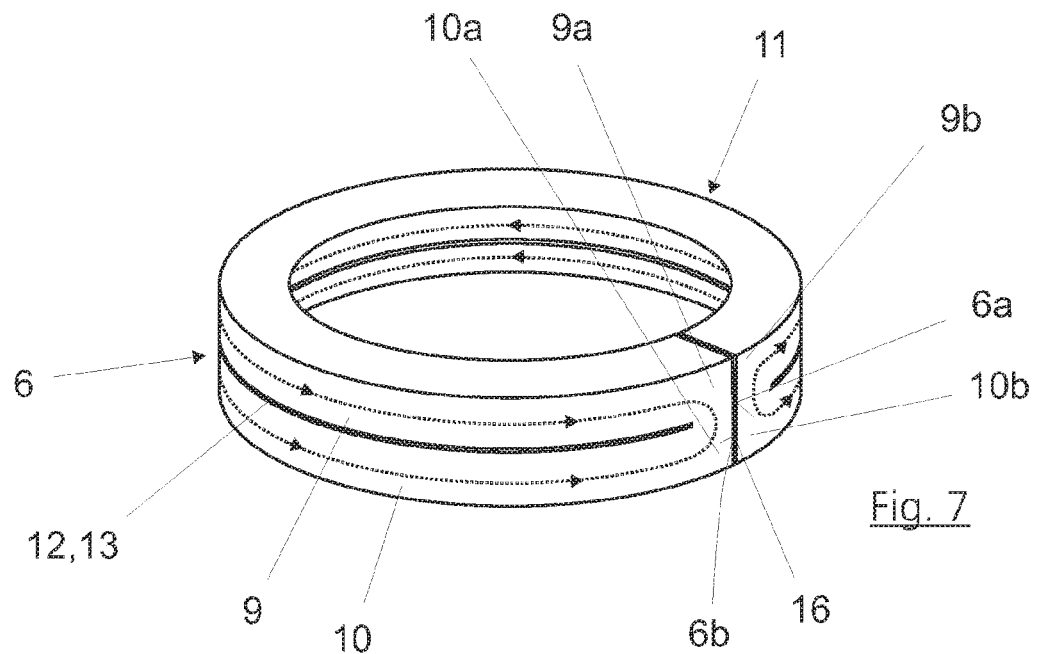
FIG. 7 shows a schematic illustration of a stator holder for the radial fastening of a stator (not illustrated), with arrows illustrating the flow direction of the eddy currents induced in the electrically conductive paths, which eddy currents act counter to one another.

As is schematically illustrated in more detail in FIGS. 6 and 7, the paths 9, 10 of the respective path pairs 11 are connected to one another in electrically conductive fashion at their respective ends 9a, 10a and 9b, 10b.

In the case of an axial fastening of the coil 5 to the stator holder 6, an embodiment of the stator holder 6 as schematically illustrated in FIG. 6 is particularly suitable. It is provided here that the paths 9, 10 of the path pair 11 are arranged on the stator holder 6 so as to be radially offset with respect to one another. In this way, it can be achieved in a particularly advantageous manner that the coil 5 induces eddy currents acting in opposite directions in the paths 9, 10.

Figure 4:
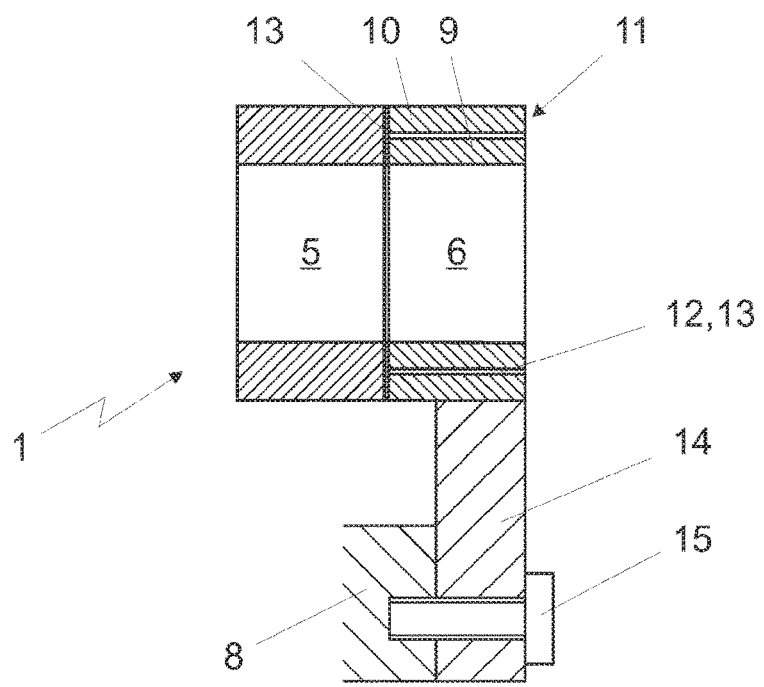
FIG. 4 shows a schematic illustration of a stator, embodied as a coil of electromagnetic drive, with an axial fastening to a stator holder.

It is preferably the case that the stator holder 6, with its two paths 9, 10, adjoins the coil 5 directly or via an adhesive layer or an adhesive 13 or the like, as illustrated by way of example in FIGS. 3 and 4 with regard to the axial fastening.

In this way, the coil 5 induces an eddy current in each of the paths 9, 10, as illustrated on the basis of the arrow directions in FIG. 6. The arrows each show the direction or the flow direction of the induced eddy current, not the result of the counteraction thereof. If the induced eddy currents are of equal magnitude, they cancel one another out, and current no longer flows through the paths, that is to say there is also no longer a resultant current flow direction. If one of the induced eddy currents is dominant, then the current flows through both paths in the direction predefined by the more intensely induced eddy current. Owing to the connection of the paths 9, 10 at their ends 9a, 10a and 9b, 10b respectively, the eddy currents induced in the paths counteract one another and reduce one another or preferably completely cancel one another out, such that an induction action of the coil 5 on the stator holder 6 is at least approximately, preferably completely, canceled out. As a result, the stator holder 6 itself generates no relevant magnetic field, preferably no magnetic field, that could retard or adversely affect the desired movement of the actuating element 7.

In this regard, it is advantageous if the paths 9, 10 of the path pair 11 are designed and/or arranged such that the eddy currents induced in the paths 9, 10 of the path pair 11 quantitatively at least approximately correspond. The radially offset arrangement of the paths 9, 10 shown in FIG. 6 is suitable for this purpose in the case of an axial fastening of the coil 5 to the stator holder 6.

Figure 8:
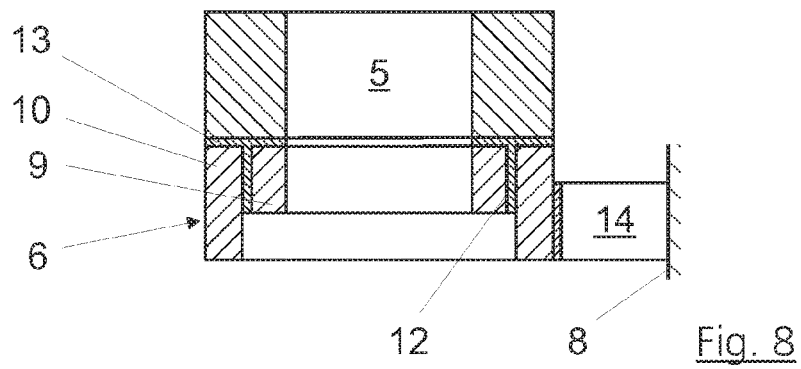
FIG. 8 shows a schematic illustration of a stator holder with an axially fastened stator embodied as a coil, wherein an inner and an outer electrically conductive path have different axial lengths.
Figure 9:
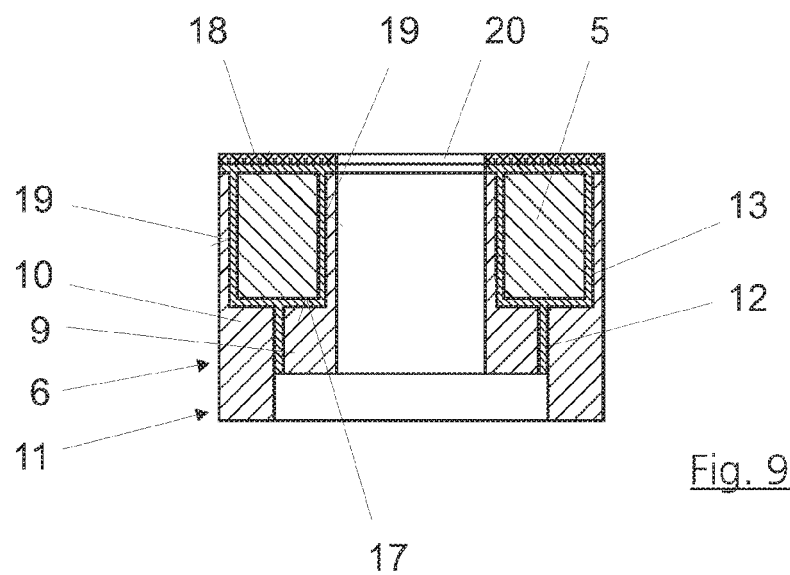
FIG. 9 shows a schematic illustration of an embodiment of the stator holder for encapsulating the stator, embodied as a coil, with an axial fastening.
Figure 10:
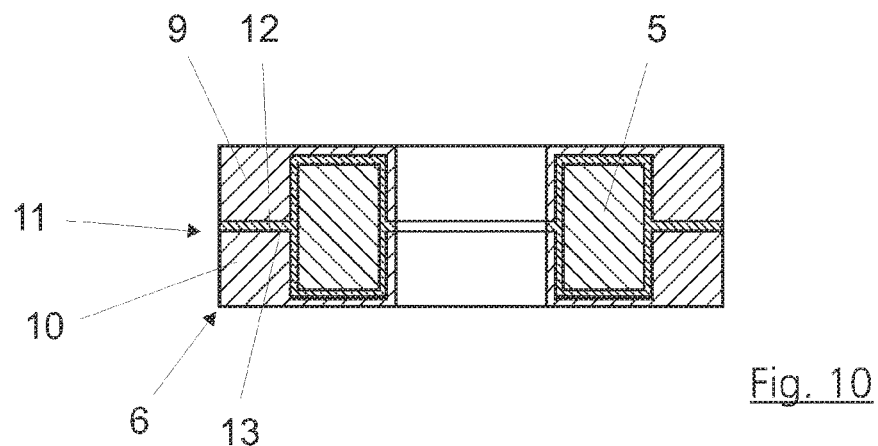
FIG. 10 shows a schematic illustration of an embodiment of the stator holder for encapsulating the stator, embodied as a coil, with a radial fastening.

To realize a quantitatively at least approximately corresponding intensity of the eddy currents in the paths 9, 10, the greatest possible degree of symmetry of the paths 9, 10 is advantageous. This is realized only to a limited extent in the case of a radially offset arrangement. To influence the eddy currents induced in the paths 9, 10, it may thus be provided, in the case of an embodiment of the stator holder 6 which is designed for an axial fastening of the coil 5, that a radially inner path 9 of the path pair 11 is designed to be shorter in an axial direction, and/or to have a smaller radial thickness, than a path 10, running adjacent to the former path and situated radially further to the outside, of the path pair 11. FIGS. 8 and 9 illustrate, by way of example, an axially relatively short form of the radially inner path 9 of a path pair 11.

It is pointed out that it may basically also be possible to choose some other structural configuration for the paths 9, 10. With awareness of the disclosure and using the knowledge imparted here that the axial length or the radial thickness of the path pairs 11 may be varied, a person skilled in the art is capable of configuring the paths 9, 10 of a path pair 11 such that the eddy currents induced in the paths 9, 10 of the path pair 11 quantitatively at least approximately correspond. For this purpose, use may for example be made of simulation models and/or further analytical and/or heuristic methods.

In the case of a stator holder 6 which is provided for the axial fastening of the coil 5, the paths 9, 10 of a path pair 11 are preferably formed by an electrically insulating gap 12 which runs in an axial direction between the ends 9a, 9b, 10a, 10b of the paths. This is illustrated by way of example in FIGS. 3, 4 and 6. Here, the gap 12 runs between the ends 9a, 9b, 10a, 10b of the paths 9, 10 such that, according to the disclosure, the paths 9, 10 are connected at their ends 9a, 10a and 9b, 10b respectively, but, between the ends 9a, 9b, 10a, 10b, the paths run in a manner separated from and electrically insulated with respect to one another, such that the eddy currents acting in opposite directions can form in the paths 9, 10.

An adhesive 13 with insulating characteristics or an adhesive which is electrically non-conductive may be introduced into the gap 12. This is illustrated schematically in FIGS. 8 and 9.

FIG. 4 shows a stator holder 6 to which a coil 5 is fastened axially. In FIG. 4, for the sake of clarity, the illustration does not show an actuating element 7, which could for example also be merely of rod-shaped form and situated within the coil 5 (that is to say does not encompass the coil at the outside). Illustrated by way of example in FIG. 4 is a fastening of the stator holder 6 via a radial elongation 14 to a machine frame 8, which is illustrated merely by way of example. The radial elongation 14 may be formed in one piece with the stator holder 6 or may be connected as a separate component, for example via an adhesive connection, to the stator holder. In the case of an embodiment in one piece with the stator holder 6, the radial elongation 14 may analogously have electrically insulating gaps in order to prevent local short circuits.

For the fastening of the radial elongation 14 to a machine frame 8, a fastening element 15, which may be in the form of a bolt, is illustrated by way of example.

Figure 5A:
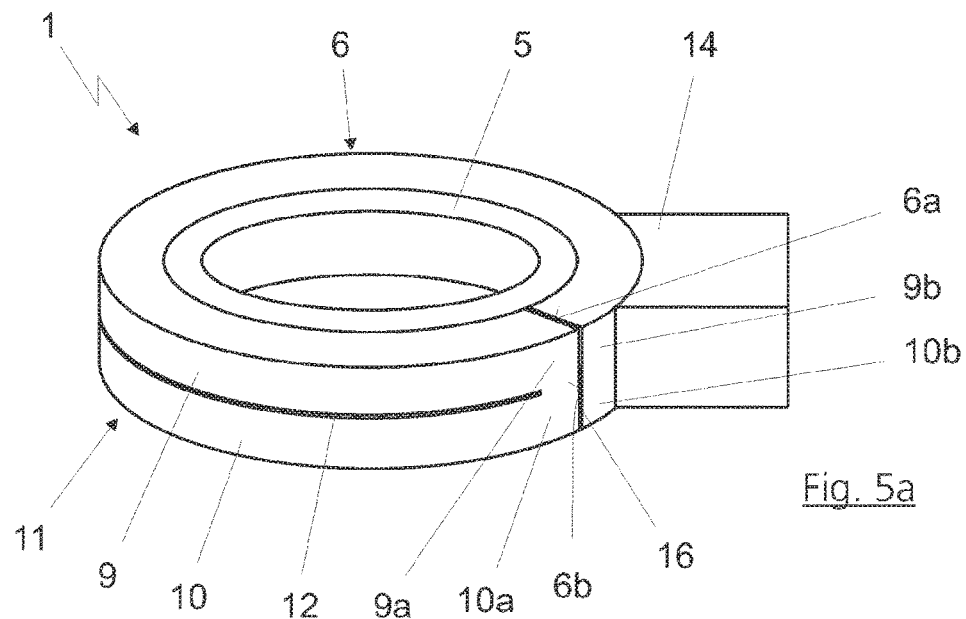
FIG. 5*a* shows a schematic illustration of a stator, embodied as a coil of an electromagnetic drive, in a second embodiment with a radial fastening to a stator holder.

FIG. 5a shows an electromagnetic drive 1 in the case of which the coil 5 is fastened radially to the stator holder 6. For the sake of clarity, the actuating element is not illustrated here. Here, the stator holder 6 may in turn be connected via a radial elongation 14 to a machine frame (not illustrated in any more detail here). The design or the presence of a radial elongation 14 is however not of importance in the context of the disclosure.

As can be seen from FIG. 5a, the stator holder 6 which is designed for a radial fastening of the coil 5 is formed, in the exemplary embodiment, with two paths 9, 10 which are arranged axially offset with respect to one another and form a path pair 11. Here, the paths 9, 10 adjoin the coil 5 again directly or preferably via an adhesive layer, for example an adhesive 13 (FIG. 10), or the like, such that the coil 5 can induce eddy currents acting in opposite directions in the paths 9, 10. The profile of the induced eddy currents is illustrated in FIG. 7 for a radial fastening of the coil 5 (not illustrated in the figure). Owing to the connection of the paths 9, 10 in the region of the ends 9a, 9b, 10a, 10b thereof, the eddy currents induced in the paths 9, 10 by the coil 5 counteract one another and reduce one another or preferably completely cancel one another out.

To achieve complete canceling-out of the eddy currents induced in the paths 9, 10, in order that the induction action of the coil on the stator holder 6 is canceled out entirely, a symmetrical configuration of the paths 9, 10 may in turn be advantageous. This can be achieved more easily in the case of a radial fastening of the coil 5 in the stator holder 6 than in the case of an axial arrangement of the coil 5 on the stator holder 6.

The paths 9, 10 of the path pair 11 illustrated in FIGS. 5a and 7 are preferably formed by an electrically insulating gap 12 which runs between the ends 9a, 9b, 10a, 10b of the paths. As has already been described with regard to the gap 12 in the case of the stator holder 6 provided for the axial fastening, an adhesive 13 may be introduced into the gap 12. This is illustrated schematically in FIG. 10. With regard to further details, variants and embodiments of the stator holder 6 as per FIGS. 5a and 7, reference is made to the embodiments relating to the stator holder 6 as per FIGS. 3, 4 and 6.

It is basically also possible for the paths 9, 10 of the stator holder 6 as per FIGS. 5a and 7 to have different axial lengths and/or different radial thicknesses, should this be advantageous in order that the induced eddy currents, in the best case, completely cancel one another out.

As can be seen from FIGS. 5a, 6 and 7 the stator holder 6 illustrated in the exemplary embodiment has at least one gap 16 running in an axial direction, such that the stator holder 6 has two ends 6a, 6b which face one another, and are spaced apart from one another, in a circumferential direction. Here, it is preferably provided that that the ends 9a, 10a and 9b, 10b respectively of the paths 9, 10 of a path pair 11 are electrically connected to one another in each case in the region of the ends 6a, 6b, which face one another in a circumferential direction, of the stator holder 6. This is correspondingly illustrated in FIGS. 5a, 6 and 7.

Figure 5B:
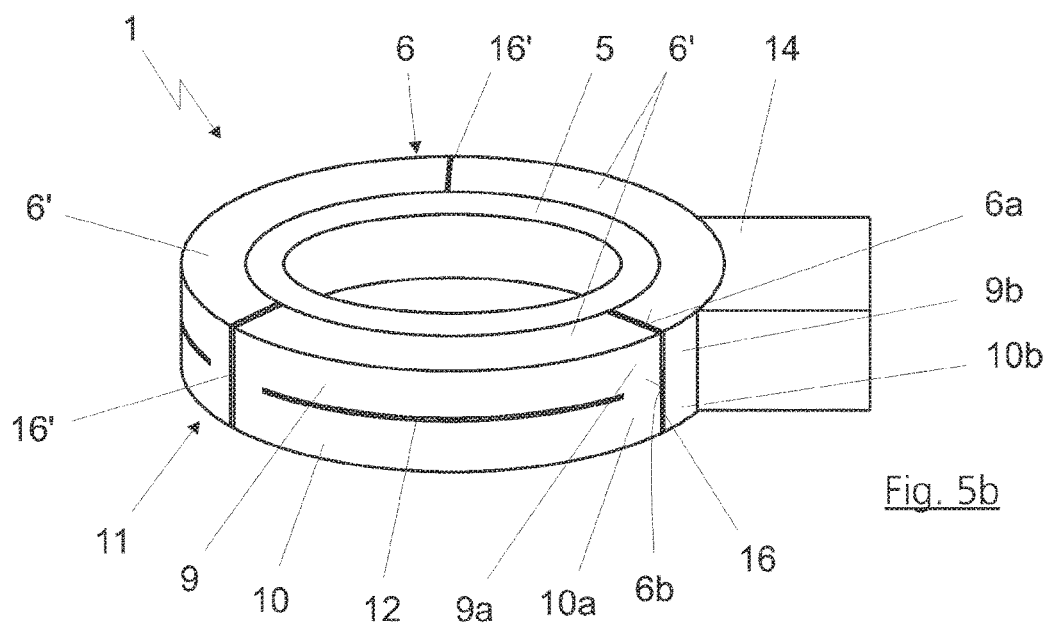
FIG. 5*b* shows a schematic illustration of a stator, embodied as a coil as per FIG. 5*a*, with a subdivision of the stator holder into multiple stator holder segments.

FIG. 5b shows an optional embodiment. Unless illustrated otherwise, the embodiment as per FIG. 5b may correspond to the embodiment as per FIG. 5a. In the optional embodiment illustrated in FIG. 5b, it may be provided that the stator holder 6 has multiple stator holder segments 6' which are electrically separated from one another in a circumferential direction, wherein the stator holder segments may have in each case at least two electrically conductive paths 9, 10 running separately from and adjacent to one another, and in each case two paths 9, 10 running separately from and adjacent to one another form a path pair 11, and the paths of the path pair of a stator holder segment 6' are connected to one another in electrically conductive fashion at their respective ends 9a, 10a and 9b, 10b. This may be easily realized by virtue of the stator holder 6 having multiple gaps 16' running in an axial direction.

FIG. 9 illustrates, by way of example for an axial fastening of the coil 5 on the stator holder 6, an encapsulation of the coil 5.

The coil 5 illustrated in FIG. 9 has a fastening surface 17 for the fastening to the stator holder 6 or to the paths 9, 10, has an exposed surface 18 formed at an oppositely situated end of the coil 5, and has two side surfaces 19 which run preferably at right angles to the former surfaces and parallel to one another. Here, the stator holder 6 adjoins the fastening surface 17. For the encapsulation of the coil 5, in each case one electrically conductive path 9, 10 at least partially, and in the exemplary embodiment completely, encompasses a side surface 19. Also provided is a cover 20 which covers the exposed surface 18 and is connected to the two paths 9, 10. Here, the cover 20 may itself have an electrically insulating action. In the exemplary embodiment, the cover 20 is however formed from metal, preferably titanium, and is connected at least to one of the two paths 9, 10 via an electrically insulating adhesive 13. In the exemplary embodiment, the cover 20 is connected to both paths 9, 10 via the electrically insulating adhesive 13.

Such an embodiment may basically also be realized in the case of a stator holder 6 which is provided for a radial fastening of the coil 5. For the radial fastening of a coil 5 to a stator holder 6, however, it has proven to be advantageous to choose the configuration illustrated in principle in FIG. 10, if an encapsulation is desired. Here, it is provided that the coil 5 is encapsulated approximately completely by the paths 9, 10—even at the exposed surface 18. It is provided here that the paths 9, 10 do not make contact in the region of the exposed surface 18, but rather that the electrically insulating adhesive 13 is preferably used between the paths 9, 10 at this location.

In the exemplary embodiments, it may be provided that the electrically insulating adhesive 13 is introduced into the gaps 12 between two electrically conductive paths 9, 10, running adjacent to one another, of a path pair 11 and/or into the gap 16 between two ends 6a, 6b, facing one another in a circumferential direction, of the stator holder 6 or of the stator holder segments 6' and/or between the coil 5 and the stator holder 6 and/or the coil 5 and the cover 20 and/or the paths 9, 10 and the cover 20.

What is claimed is:

1. An electromagnetic drive, comprising:
a stator, comprising a stator holder; and
an actuating element movable via electromagnetic interaction with the stator,
wherein:
the stator holder comprises a path pair comprising first and second electrically conductive paths running separately from each other and adjacent to each other;
an end of the first path is electrically connected to an end of the second path;
the first and second paths are configured so that, during use of the electromagnetic drive, at least one element selected from the group consisting of the stator and the actuating element induces eddy currents acting in opposite directions in the paths;
the stator holder comprises a gap running in an axial direction so that the stator holder comprises a first end and a second end facing the first end; and
the first and second ends of the stator holder are spaced from each other in a circumferential direction.

2. The electromagnetic drive of claim 1, wherein:
the end of the first path faces is connected to the end of the second path in a region of the first and second ends of the stator holder; and
the first and second ends of the stator holder face each other in the circumferential direction.

3. The electromagnetic drive of claim 1, wherein:
the stator holder comprises multiple stator holder segments electrically separated from each other in the circumferential direction;
each stator holder segment comprises a path pair comprising first and second electrically conductive paths running separately from and adjacent each other; and
for each stator holder segment, the first path comprises an end that is electrically connected to an end of the second path.

4. The electromagnetic drive of claim 2, wherein:
each stator segment is arranged axially on the stator holder;
for each stator segment, its first and second paths are arranged on the stator holder; and
for each stator segment, its first and second ends are radially offset relative to each other.

5. The electromagnetic drive of claim 1, wherein:
the stator is arranged axially on the stator holder;
the first and second paths are arranged on the stator holder; and
the first and second ends are radially offset relative to each other.

6. The electromagnetic drive of claim 5, wherein an electrically insulating gap runs in the axial direction between the end of the first path and the end of the second path.

7. The electromagnetic drive of claim 6, wherein:
the first path is radially inward from the second path; and
in the axial direction, at least one of the following holds:
i) the first path is shorter than the second path; and ii) the first path has a smaller radial thickness than the second path.

8. The electromagnetic drive of claim 6, further comprising an adhesive, wherein at least one of the following holds:

the adhesive is in the gap between the first and second paths;

the adhesive is in the gap between two ends of the stator holder;

the adhesive is between the stator and the stator holder;

the adhesive is between the stator and a cover; and the adhesive is between the cover and the first and second paths.

9. The electromagnetic drive of claim 5, wherein:

the first path is radially inward from the second path; and in the axial direction, at least one of the following holds:
i) the first path is shorter than the second path; and ii) the first path has a smaller radial thickness than the second path.

10. The electromagnetic drive of claim 5, further comprising an adhesive, wherein at least one of the following holds:

the adhesive is in a gap running axially between the first and second paths;

the adhesive is in the gap between two ends of the stator holder;

the adhesive is between the stator and the stator holder;

the adhesive is between the stator and a cover; and the adhesive is between the cover and the first and second paths.

11. The electromagnetic drive of claim 1, wherein:

the stator is arranged radially on the stator holder; and the first and second paths are arranged on the stator holder and axially offset relative to each other.

12. The electromagnetic drive of claim 1, wherein an electrically insulating gap runs in the radial direction between the ends of the first and second paths.

13. The electromagnetic drive of claim 1, wherein the first and second are configured so that, during use of the electromagnetic drive, an induction action of the stator and/or of the actuating element on the stator holder is at least approximately cancelled out.

14. The electromagnetic drive of claim 1, wherein the stator holder is configured to that an inductive coupling factor between the stator and/or the actuating element, on the one hand, and the stator holder, on the other hand, is less than 0.1.

15. The electromagnetic drive of claim 1, wherein the first and second paths are configured so that, during use of the electromagnetic drive, eddy currents induced in the first path at least approximately quantitatively correspond to eddy currents induced in the second path.

16. The electromagnetic drive of claim 1, wherein the stator holder encapsulates the stator.

17. The electromagnetic drive of claim 1, further comprising a cover, wherein:

the stator comprises a fastening surface configured to fasten to the stator holder, an exposed surface on an opposite end of the stator, and first and second side surfaces which run at right angles to the former and parallel to each other;

the stator holder adjoins the fastening surface;

the first path at least partially encompasses the first side surface; and the cover covers the exposed surface and is connected to the first and second two paths to encapsulate the stator.

18. An apparatus, comprising:

an illumination system, comprising:
an electromagnetic drive according to claim 1; and
an optical unit comprising an optical element which is adjustable and/or manipulatable and/or deformable via the electromagnetic drive, wherein the apparatus is a semiconductor lithography projection exposure apparatus.

19. The apparatus of claim 18, further comprising a projection objective.

20. The apparatus of claim 19, further comprising a radiation source.

* * * * *

UNITED STATES PATENT AND TRADEMARK OFFICE
CERTIFICATE OF CORRECTION

PATENT NO. : 10,274,846 B2
APPLICATION NO. : 15/906346
DATED : April 30, 2019
INVENTOR(S) : Jasper Wesselingh and Axel Lorenz Page 1 of 1

It is certified that error appears in the above-identified patent and that said Letters Patent is hereby corrected as shown below:

In the Specification

Column 13, Line 8: Delete "that that" and insert -- that --, therefor.

In the Claims

Column 15, Lines 33 and 34 (Claim 13): Delete "first and second are" and insert -- first and second paths are --, therefor.

Signed and Sealed this
Twentieth Day of August, 2019

Andrei Iancu
*Director of the United States Patent and Trademark Office*